US012648158B2

(12) United States Patent
Sharma et al.

(10) Patent No.: US 12,648,158 B2
(45) Date of Patent: Jun. 2, 2026

(54) INTEGRATED SRAM MEMORY TAG CIRCUITRY AND DRAM MEMORY CELL ARCHITECTURES

(71) Applicant: Intel Corporation, Santa Clara, CA (US)

(72) Inventors: Abhishek A. Sharma, Portland, OR (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 389 days.

(21) Appl. No.: 17/558,405

(22) Filed: Dec. 21, 2021

(65) Prior Publication Data

US 2023/0200093 A1 Jun. 22, 2023

(51) Int. Cl.
| | |
|---|---|
| *H10W 90/00* | (2026.01) |
| *H10B 12/00* | (2023.01) |
| *H10B 80/00* | (2026.01) |
| *H10B 99/00* | (2023.01) |
| *H10W 90/20* | (2026.01) |

(52) U.S. Cl.
CPC ..................................... *H10B 99/00* (2023.02)

(58) Field of Classification Search
CPC ... H01L 25/0657; H01L 25/074; H01L 25/04; H01L 25/18; H01L 2225/06503; H10B 80/00; H10B 12/50; H10W 90/00; H10W 90/20
See application file for complete search history.

(56) References Cited

U.S. PATENT DOCUMENTS

| | | | | |
|---|---|---|---|---|
| 2011/0024844 A1* | 2/2011 | Ouchi | ..................... | H10B 10/12 |
| | | | | 257/E27.06 |
| 2019/0131308 A1* | 5/2019 | Fardad | .................... | G11C 29/12 |
| 2019/0267088 A1* | 8/2019 | Jeon | .................... | H01L 23/5329 |
| 2020/0328188 A1* | 10/2020 | Liu | ......................... | H01L 25/50 |

* cited by examiner

*Primary Examiner* — Jay C Kim
*Assistant Examiner* — John Lin
(74) *Attorney, Agent, or Firm* — Essential Patents Group, LLP

(57) ABSTRACT

Memory device architectures including integrated static random access memory based tag circuitry and dynamic random access memory cells are discussed related to improving density and device performance Such memory device architectures include vertically aligned dynamic random access memory cells and memory tag circuitry aligned and implemented within the same monolithic integrated circuit die or on stacked interconnected monolithic integrated circuit dies.

21 Claims, 10 Drawing Sheets

400     WL 421

415          416

BL 422          BL 423

411

412          413

414

417

450

SL* 463     BL 464          BL* 465     SL 466

ML 461          452

451          451

451

WL 462

Parallel to Gate 591

1100

Receive Monolithic Integrated Circuitry and Memory Array 1101

Form Metallization Interconnects 1102

Couple Received Die to Second Die or Substrate 1103

Multi-Chip Stack with Vertically Aligned Memory Array and Tag Circuitry 1104

INTEGRATED SRAM MEMORY TAG CIRCUITRY AND DRAM MEMORY CELL ARCHITECTURES

BACKGROUND

Demand for integrated circuits (ICs) in portable electronic applications has motivated higher levels of semiconductor device performance and integration. For example, devices demand memory solutions that use lower power, perform read and write operations more quickly, and offer improved reliability. Furthermore, ever more compact memory architectures are desirable. Embedded memory may be integrated with a host integrated circuit as a multi-chip module (MCM) or may be monolithically integrated with a host IC (i.e., both memory and the host IC fabricated on the same chip). For embedded memory applications, reducing the overall memory array footprint helps achieve larger memories and reduced device cost. It is with respect to these and other considerations that the present improvements have been needed. Such improvements may become critical as increased memory performance is needed to drive higher performance integrated circuit electronic devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
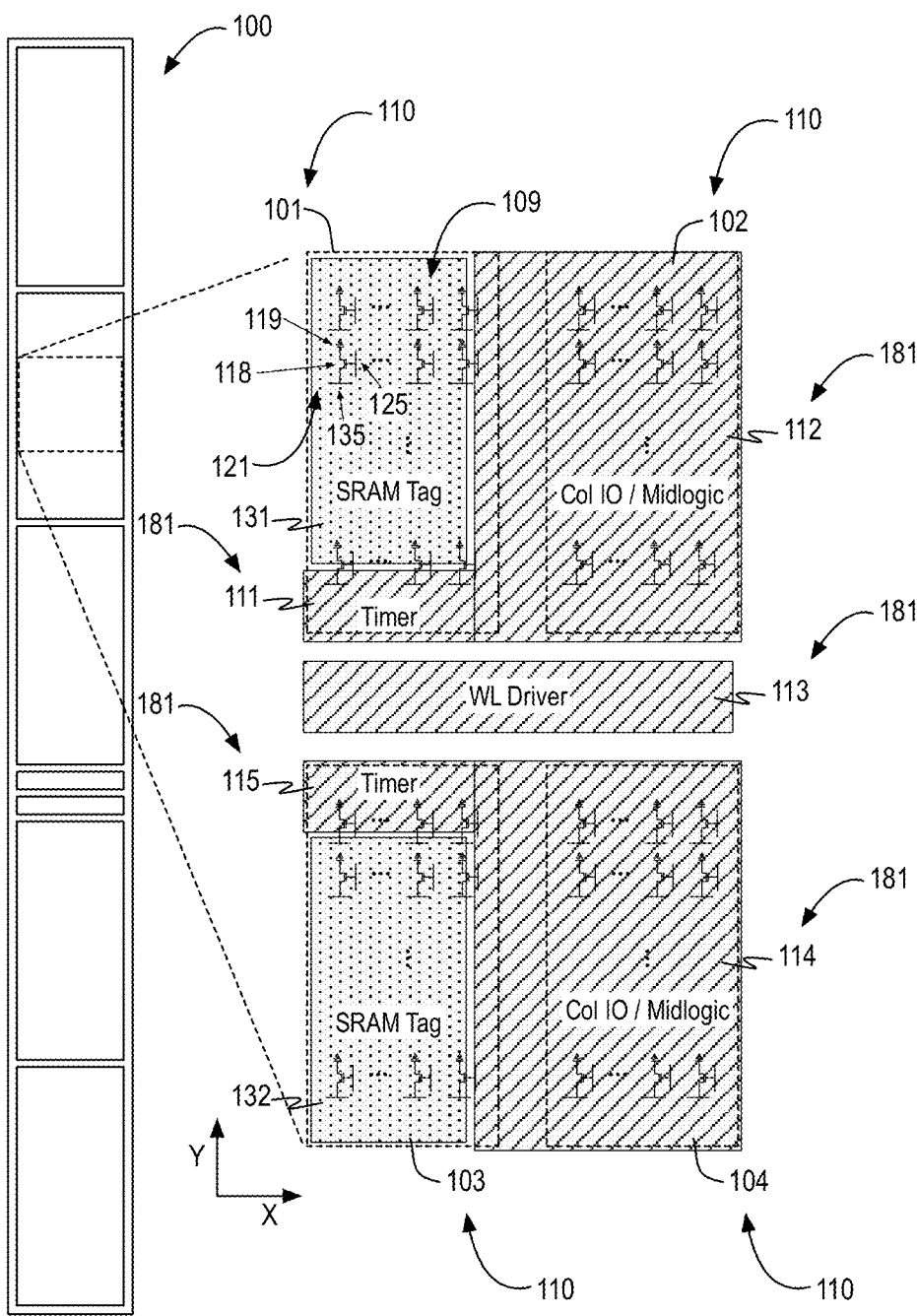
FIG. 1 illustrates an exemplary integrated memory device including one or more arrays of dynamic random access memory cells provided over memory tag circuitry including static random access memory cells.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage.

Herein, the terms memory tag circuitry, tag circuitry, memory tag, and the like indicate circuitry capable of receiving a memory address, validating the memory address, and signaling a request for data corresponding to the memory address (i.e., using the memory address or other data structure). The term integrated indicates the components of the integrated object, device, or system are not easily separated and are not meant to be separated in operation. As used herein, the terms monolithic, monolithically integrated, and similar terms indicate the components of the monolithic overall structure form a indivisible whole not reasonably capable of being separated. The term support circuitry indicates integrated circuitry meant to achieve an operation in support of the device in which it is implemented. In the context of memory devices, support circuitry may be implemented to perform memory tag operations, I/O operations, mid-logic operations, driver operations, or others.

Memory architectures and related support transistor circuitry structures are described herein related to closely integrating memory tag circuitry as implemented with static random access memory cells with dynamic random access memory cell arrays.

As discussed, it is desirable to increase memory density and to improve memory device performance in terms of power usage, read and write operation speed, and reliability. In some embodiments, a memory device includes an array of dynamic random access memory cells in a first lateral plane, individual ones of the dynamic random access memory cells of the array comprising a select transistor and a capacitor structure, and memory tag circuitry integrated with the array of memory cells, such that the memory tag circuitry includes a plurality of static random access memory cells in a second lateral plane vertically offset with respect to the first lateral plane with the memory tag circuitry and the array of dynamic random access memory cells vertically aligned. In some embodiments, the memory tag circuitry is to determine a received memory address is valid, and, in response to being validated, signal the dynamic random access memory cells to retrieve data corresponding to the received memory address. In some embodiments, the array of dynamic random access memory cells and memory tag circuitry are integrated by being in the same monolithic integrated circuit die. In such embodiments, the monolithic integrated circuit die may be attached to a second monolithic integrated circuit die or a substrate. The second monolithic integrated circuit die or substrate may include other support circuitry for the memory.

In some embodiments, the array of dynamic random access memory cells and memory tag circuitry are integrated with the array of dynamic random access memory cells in one monolithic integrated circuit die and the memory tag circuitry another monolithic integrated circuit die such that the first monolithic integrated circuit die and second monolithic integrated circuit die are coupled and vertically aligned. The coupling may be provided by metal bump structures, hybrid bonding structures, or others. In such embodiments, the first monolithic integrated circuit die may further include support circuitry including transistors arrayed in a lateral plane. In some embodiments, the arrayed transistors are between the array of dynamic random access memory cells and the second monolithic integrated circuit die.

Thereby, a back end of line (BEOL) memory array is provided such that dynamic random access memory (DRAM) cells are provided in a full metallization stack with memory tag circuitry and/or support circuitry (i.e., timing circuitry, IO circuitry, mid-logic circuitry, driver circuitry, etc.) provided under and integrated in the same monolithic integrated circuit (IC) die as the DRAM cells. In embodiments where the memory tag circuitry is not provided therein, the memory tag circuitry is provided in a second IC die that is stacked and vertically bonded with the IC die including the DRAM cells. The memory tag circuitry includes static random access memory (SRAM) cells to implement the memory tag circuitry. Such SRAM cells may be any suitable SRAM cells such as 6T (six transistor) cells having cross-coupled inverters, content addressable memory (CAM) cells having six transistors and four comparison transistors, or others. Such tag circuitry and/or support circuitry may include any suitable transistor architecture such as planar transistors, tri-gate transistors, gate all around transistor, or the like.

FIG. 1 illustrates an exemplary integrated memory device 100 including one or more arrays of dynamic random access memory cells provided over memory tag circuitry including static random access memory cells, arranged in accordance with at least some implementations of the present disclosure. As shown in FIG. 1, integrated memory device 100 is provided as an integrated device that may be deployed as part of a memory module, as a component in a computing device, or the like. The computing device may be any device or system such as a server, a personal computer, a laptop computer, a tablet, a phablet, a smart phone, a digital camera, a gaming console, a wearable device, a display device, an all-in-one device, a two-in-one device, or the like. For example, as used herein, a system, device, computer, or computing device may include any such device or platform.

In the illustrated example, DRAM segments or caches 101, 102, 103, 104 each includes an array 110 of dynamic random access memory cells 109. Each of memory segments 101, 102, 103, 104 is illustrated with hatched perimeter lines and an array of DRAM cells 109 arrayed therein. Each of DRAM cells 109 includes a select transistor 118 and a capacitor 119, and each of DRAM cells 109 is connected to a word line 125 and a bit line 135 as shown with respect to exemplary memory cell 121. Each word line 125 accesses a number of DRAM cells 109 along the y-direction and each bit line 135 accesses a number of DRAM cells 109 in the x-direction (or vice versa). Such memory cells 109 are arrayed in, for example, a grid pattern in the x-y plane. As used herein, any plane substantially parallel to the x-y plane is characterized as a lateral plane. Such lateral planes are orthogonal to the vertical direction or dimension (i.e., the z-direction).

Support circuitry modules 111, 112, 113, 114, 115 and/or tag circuitry modules 131, 132 each includes a number of integrated transistors 181 in a device layer. Each of support circuitry modules 111, 112, 113, 114, 115 is illustrated with a solid perimeter line and hatching. Each of tag circuitry modules 131, 132 is illustrated with a solid perimeter and dotted fill. Each of support circuitry modules 111, 112, 113, 114, 115 and tag circuitry modules 131, 132 include a number of integrated transistors 181 also arrayed in the x-y plane (i.e., a lateral plane) with the lateral plane of support circuitry modules 111, 112, 113, 114, 115 and tag circuitry modules 131, 132 being offset vertically with respect to the lateral plane of DRAM segments or caches 101, 102, 103, 104.

For example, support circuitry modules 111, 112, 113, 114, 115 and tag circuitry modules 131, 132 may be implemented in the "shadow" of one or more of DRAM segments 101, 102, 103, 104 such that entireties or portions of support circuitry modules 111, 112, 113, 114, 115 and tag circuitry modules 131, 132 are vertically aligned with entireties or portions of DRAM segments 101, 102, 103, 104. Notably, the shadows of DRAM segments 101, 102, 103, 104 are typically not used for support and/or tag circuitry and instead typically include interconnect routing and power structures.

As discussed, at least portions of support circuitry modules 111, 112, 113, 114, 115 and/or tag circuitry modules 131, 132 are under portions of DRAM segments 101, 102, 103, 104 such that support circuitry modules 111, 112, 113, 114, 115 and/or tag circuitry modules 131, 132 and DRAM segments 101, 102, 103, 104 are stacked in the z-direction. For example, at least portions of DRAM segments 101, 102,

103, 104 are in the positive z-direction with respect to pertinent portions of support circuitry modules 111, 112, 113, 114, 115 and/or tag circuitry modules 131, 132. In some embodiments, portions or an entirety of any of DRAM segments 101, 102, 103, 104 may not have underlying support circuitry and/or memory tag circuitry. Similarly, one or more of support circuitry modules 111, 112, 113, 114, 115 and/or tag circuitry modules 131, 132, or portions thereof, may not have overlying DRAM cells. Such DRAM segments 101, 102, 103, 104 and support circuitry modules 111, 112, 113, 114, 115 and/or tag circuitry modules 131, 132 are structured as discussed further herein below.

Figure 5:
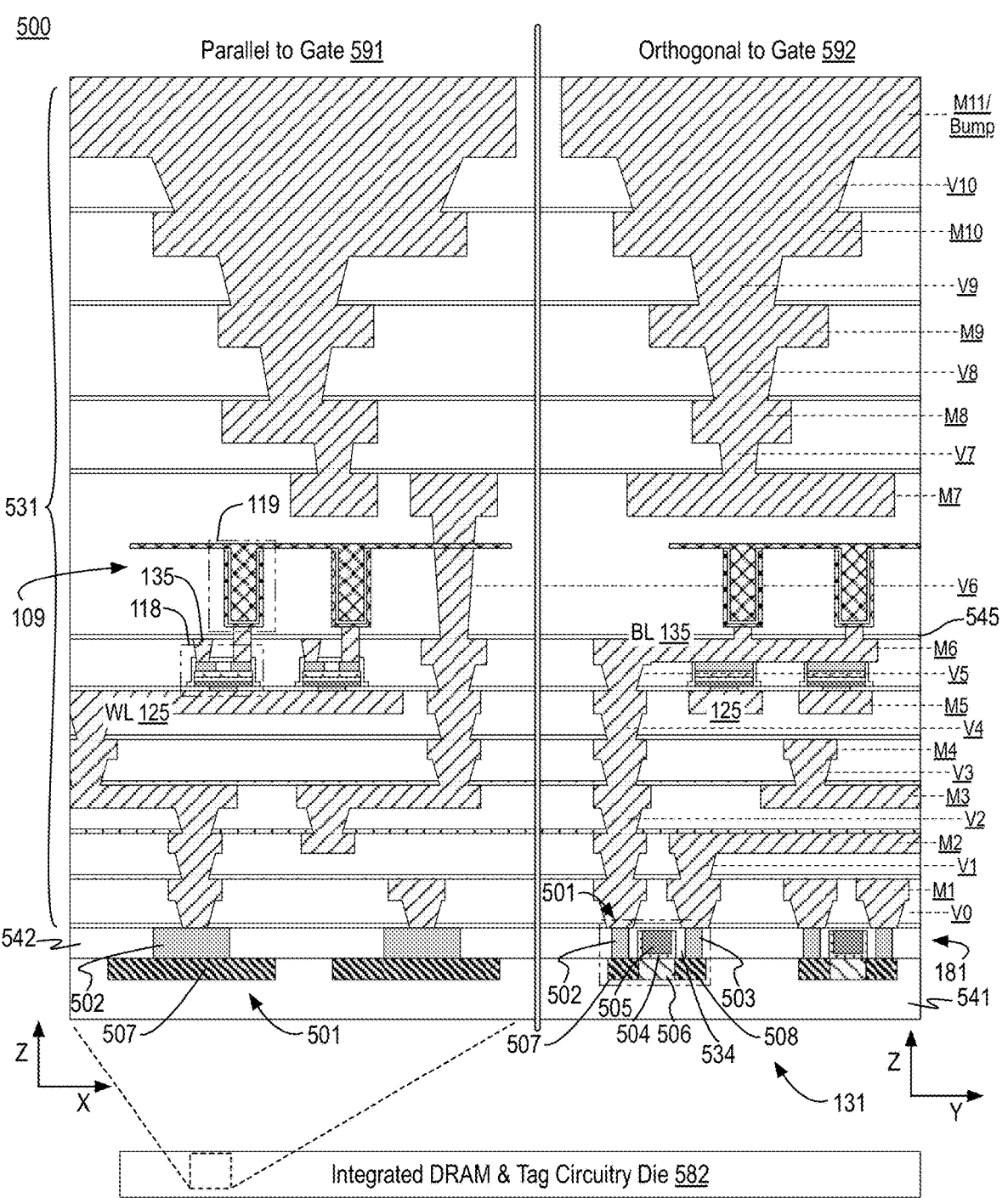
FIG. 5 provides two cross-sectional views of an exemplary memory device having integrated memory tag circuitry underlying an array of dynamic random access memory cells.

For example, as discussed further herein with respect to FIG. 5, DRAM cells 109 may be provided within or embedded in metallization layers that integrate DRAM cells 109 to transistors 181 such that DRAM cells 109, transistors 181, and the metallization layers are integrated into the same monolithic IC die. In other examples, DRAM segments 101, 102, 103, 104 and support circuitry modules 111, 112, 113, 114, 115 and/or tag circuitry modules 131, 132 are provided in separate monolithic IC dies that may be integrated via die to die bonding. Furthermore, in some embodiments, a vertically aligned three-layer stack may be achieved including a first layer including an array of DRAM cells, a second layer including transistor circuitry implementing one of tag memory circuitry or support circuitry and a third layer including transistor circuitry implementing the other of tag memory circuitry or support circuitry. For example, the DRAM cells and one transistor layer may be integrated into a first monolithic IC die and the other transistor layer may be integrated into a second monolithic IC die that is attached (i.e., using metal bump structures or hybrid bonding) to the first monolithic IC die.

In the example of FIG. 1, memory device 100 includes support circuitry modules 111, 112, 113, 114, 115 inclusive of timer circuitry, as implemented by support circuitry modules 111, 115, column input/output (IO) circuitry, as implemented by support circuitry modules 112, 114, midlogic circuitry, as implemented by support circuitry modules 112, 114, and word line driver circuitry, as implemented by support circuitry modules 113. However, support circuitry modules 111, 112, 113, 114, 115 may provide any support or control functions for memory device 100 and such functionality may be implemented in any suitable architecture. Furthermore, memory device 100 includes tag circuitry modules 131, 132. In some embodiments, memory device 100 includes a single tag circuitry module. In some embodiments, a single tag circuitry module is provided for one or multiple DRAM segments 101, 102, 103, 104. Memory tag circuitry modules are capable of receiving a memory address, validating the memory address, and signaling a request for data corresponding to the memory address as discussed further herein with respect to FIG. 3.

Figure 2:
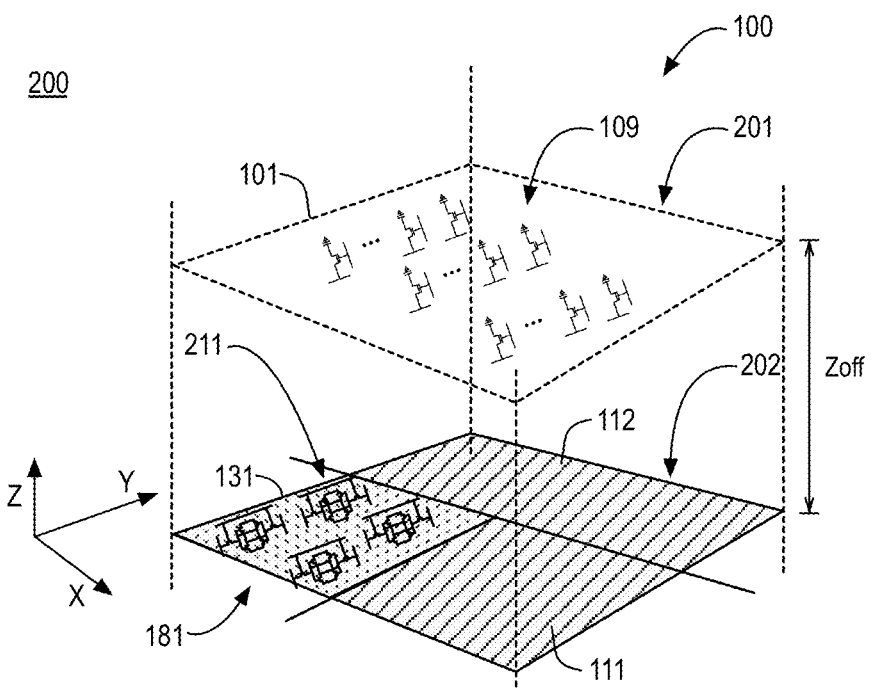
FIG. 2 illustrates an exemplary partial exploded view of the integrated memory device of FIG. 1 including arrays of dynamic random access memory cells arranged over a memory tag circuitry module and/or support circuitry modules.

FIG. 2 illustrates an exemplary partial exploded view 200 of integrated memory device 100 including arrays of dynamic random access memory cells 109 arranged over memory tag circuitry module 131 and/or support circuitry modules 111, 112, arranged in accordance with at least some implementations of the present disclosure. As shown in FIG. 2, DRAM segment 101, including an array of DRAM cells 109 arrayed in lateral plane 201, is arranged over and in vertical alignment with memory tag circuitry module 131 and/or support circuitry modules 111, 112, which are in lateral plane 202. Lateral plane 202 is substantially parallel with respect to lateral plane 201, with both being substantially orthogonal to the z-direction. The z-direction may correspond to a build up or fabrication direction of integrated memory device 100.

In FIG. 2, memory tag circuitry module 131 is illustrated as including SRAM cells 211. SRAM cells 211 may include any suitable SRAM architecture such as a 6T SRAM architecture, a content addressable memory (CAM) architecture, or the like. In any event, SRAM cells 211 include a number of transistors 181 implemented in lateral plane 202. As discussed DRAM cells 109 are implemented in lateral plane 201 such that there is a vertical offset, Zoff, between lateral planes 201, 202. The vertical offset, Zoff, may be any suitable distance such as 1 to 10 microns. The vertical offset, Zoff, may be measured based on a top of a gate electrode of a transistor of transistors 181 (or an average top gate electrode height of a sample of transistors 181 or the like) and a bottom of a gate electrode of a select transistor of DRAM cells 109 (or an average bottom gate electrode location of a sample of the select transistors or the like). Other features may be used to determine the vertical offset, Zoff.

In the embodiment of FIG. 2, DRAM segment 101 is shown as vertically aligned with (i.e., over) memory tag circuitry module 131 and support circuitry modules 111, 112. In some embodiments, DRAM segment 101 is vertically aligned with (i.e., over) only memory tag circuitry module 131 and no other circuitry is provided in the portion of lateral plane 202 in the shadow of DRAM segment 101. In some embodiments, the area of DRAM segment 101 is greater than that of memory tag circuitry module 131 and memory tag circuitry module 131 may be entirely in the shadow of DRAM segment 101. In some embodiments, at least a portion of memory tag circuitry module 131 extends laterally beyond the shadow of DRAM segment 101 (due to the area of memory tag circuitry module 131 being greater than that of DRAM segment 101 and/or due to misalignment). In a similar manner, in some embodiments, the area of DRAM segment 101 is less than that of memory tag circuitry module 131 and only a portion of memory tag circuitry module 131 may be entirely in the shadow of DRAM segment 101. As shown, in some embodiments, the shadow of DRAM segment 101 also includes additional support circuitry modules such as support circuitry modules 111, 112. Such support circuitry may include any of support circuitry modules 111, 112, 113, 114, 115 and any corresponding functionality.

As shown in FIGS. 1 and 2, memory device 100 includes an array of DRAM cells 109 in lateral plane 201 such that individual ones of the dynamic random access memory cells of the array comprising a select transistor 118 and a capacitor structure 119. Details of exemplary embodiments of DRAM cells 109 are discussed further herein below. Memory device 100 also includes memory tag circuitry modules 131, 132 integrated with the array of DRAM cells 109 such that memory tag circuitry modules 131, 132 include SRAM cells 211 in lateral plane 202, which is vertically offset with respect to lateral plane 201. One or both of memory tag circuitry modules 131, 132 are vertically aligned with the array of DRAM cells 109.

Figure 3:
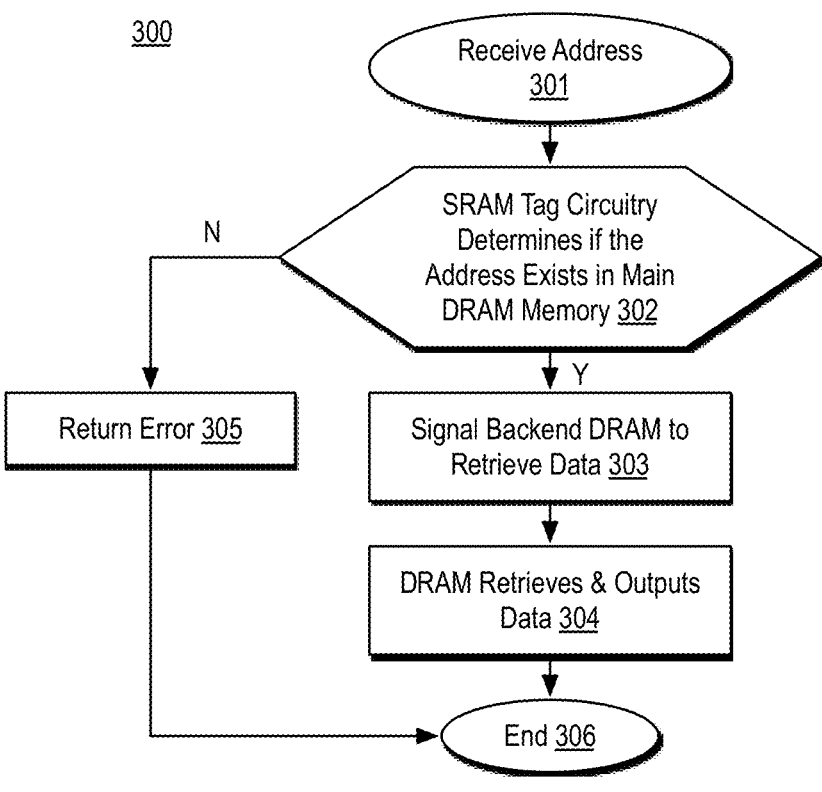
FIG. 3 illustrates a process showing exemplary operation of memory tag circuitry.

FIG. 3 illustrates a process 300 showing exemplary operation of memory tag circuitry, arranged in accordance with at least some implementations of the present disclosure. Notably, any memory tag circuitry, memory tag circuitry module, tag circuitry, or the like, discussed herein may provide or be capable of providing the operations discussed with respect to process 300. Process 300 may be performed by any memory device discussed herein.

As shown, process 300 begins at operation 301 where a memory address is received for processing. The memory address may be received from a device or module requesting data corresponding to the address such as a general purpose processor, a graphics processor, an image processor, etc. or from another memory module or device. The memory address may be in any suitable format.

Processing continues at operation 302, where the SRAM based tag circuitry determines whether the received address is a valid address that exists in the main DRAM memory. The SRAM based tag circuitry may validate the address (i.e., determine whether it is valid) using any suitable technique or techniques such as memory address comparison techniques, look up techniques, or the like. If the address is deemed to be invalid at operation 302, processing continues at operation 305, where the SRAM based tag circuitry may return an error or other signal indicating the received memory address is invalid.

If the address is deemed to be invalid at operation 302, processing continues at operation 303, where the SRAM based tag circuitry (or other support circuitry, depending on memory architecture) signals the main DRAM memory (e.g., back end memory as discussed herein) to retrieve data corresponding with the validated memory address. Processing continues at operation 304, where the DRAM memory retrieves and outputs the data corresponding to the validated memory address. The output data may be in any suitable format. Processing continues from operation 305 or operation 304 at end operation 306, where processing ends. Thereby, process 300 provides for memory tag circuitry to determine a received memory address is valid, and, in response to being validated, signal the dynamic random access memory cells to retrieve data corresponding to the received memory address. Such memory tag processing closely integrated with main DRAM memory, using the architectures and techniques discussed herein, provides for a variety of advantages including improved memory functionality, improved retrieval speeds, reduced footprint with higher functionality, and others. Such SRAM based tag circuitry may be implemented using any suitable SRAM based memory architectures such as a 6T SRAM architecture, a content addressable memory (CAM) architecture, or the like.

Figures 4A, 4B:
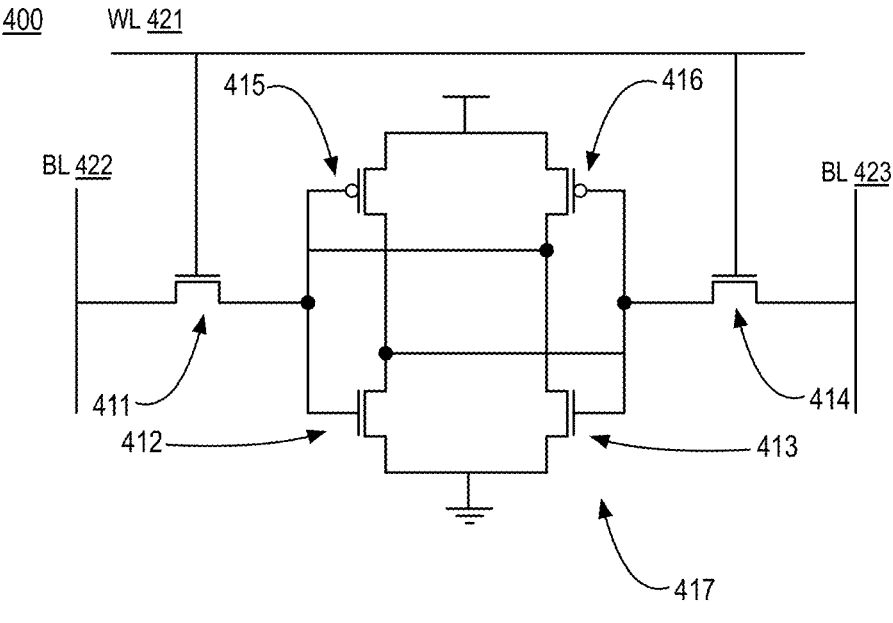
FIG. 4A illustrates an exemplary static random access memory cell for implementation in memory tag circuitry.
FIG. 4B illustrates an exemplary content addressable memory cell for implementation in memory tag circuitry.

FIG. 4A illustrates an exemplary static random access memory cell 400 for implementation in memory tag circuitry, arranged in accordance with at least some implementations of the present disclosure. For example, SRAM cell 400 may be implemented in SRAM cells 211. As shown in FIG. 4A, SRAM cell 400 includes 6 transistors 411, 412, 413, 414, 415, 416 such that transistors 411, 414 are access transistors (e.g., metal oxide semiconductor field effect transistors, MOSFETs), and transistors 412, 413, 415, 416 are configured as two inverters 417 (e.g., two complementary metal oxide semiconductor, CMOS, inverters, with NMOS transistors 412, 413 and PMOS transistors 415, 416). In operation, SRAM cell 400 can retain its stored information as long as power is supplied. SRAM cell 400 is accessed by word line 421 and bit lines 422, 423.

FIG. 4B illustrates an exemplary content addressable memory cell 450 for implementation in memory tag circuitry, arranged in accordance with at least some implementations of the present disclosure. For example, CAM cell 450 may be implemented in SRAM cells 211. As shown in FIG. 4B, CAM cell 450 includes 6 transistors 451 (e.g., a 6T SRAM cell) and 4 comparison transistors 452. CAM cell 450 word line 462, match line 461, search lines 463, 466, and bit lines 464, 465. is accessed by word line 421 and bit lines 422, 423. In operation, when data on search lines 463, 466 does not match data stored in the cell through bit lines 422, 423, match line 461 is pulled low to indicate the mismatch. If none of CAM cells 450 on a shared match line 461 indicate a mismatched bit, match line 461 remains high to indicate a word match. Thereby, CAM cell 450 may provide efficient memory tag circuitry as discussed herein. Although illustrated with respect to a 6 transistor/4 comparison transistor architecture, other CAM cell architectures may be deployed such as ternary CAM cell architectures.

FIG. 5 provides two cross-sectional views of an exemplary memory device 500 having integrated memory tag circuitry underlying an array of dynamic random access memory cells, arranged in accordance with at least some implementations of the present disclosure. On the left of FIG. 5, a parallel to gate view 591 is provided and, on the right side of FIG. 5, an orthogonal to gate view 592 is provided such that parallel and orthogonal to gate refers to the gate of a select transistor 118. Such views are divided by a vertical line to indicate they are separate views and are not a continuous view of memory device 500.

Memory device 500 includes a substrate 541, which may have a lateral surface along the x-y plane. Such lateral surface may be taken at any vertical position of substrate 541 such as a top surface of substrate 541, or at any vertical position of memory device 500. The lateral surface of the x-y plane is orthogonal to a vertical or build up dimension as defined by the z-axis. Substrate 541 may be any material known to be suitable for the fabrication of transistor circuitry. In the illustrated example, a transistor is formed partially within substrate 541. In other examples, transistor 501 is formed over or on substrate 541. Although illustrated as a planar transistor, transistor 501 may be any suitable transistor type such as a tri-gate transistor, a gate all around transistor, or the like. Substrate 541 may provide a suitable material for the formation of transistor 501 at least partially therein or it may provide a suitable surface to use as a host for the formation of transistor 501 thereon. For example, substrate 541 may be silicon, a silicon on insulator substrate, or any other host material. Substrate 541 may include additional device layer(s), metallization stack(s), or the like.

Memory device 500 as illustrated in FIG. 5, represents a portion of a monolithic integrated circuit including transistors 181, that may implement memory tag circuitry 131, fabricated over and/or on substrate 541. Memory tag circuitry 131 (or support circuitry in some embodiments) includes a number of transistors 501 that employ a channel structure 506 that may be aligned with the lateral plane of memory device 500. Channel structure 506 may also be characterized as channel material or, simply, a channel. As shown, transistors 501 each include channel structure 506 between source and drain structures 507, 508 (e.g., source and drain semiconductors). Transistors 501 each further include source and drain contacts 502, 503 to in contact with source and drain structures 507, 508 and a gate structure including a gate electrode 505 and a gate dielectric layer 504. At least a portion of gate dielectric layer 504 is on at least a portion of channel structure 506 and between channel structure 506 and gate electrode 505, such that gate electrode 505 may control channel structure 506 during operation. In the examples herein, gate dielectric layer 504 is on a bottom and sidewalls of gate electrode 505. In other embodiments, gate dielectric layer 504 is only on a bottom of gate electrode 505 but is absent sidewalls of gate electrode 505. Optional dielectric spacers 534 may be provided between the gate structure and each of source and drain contacts 502, 503. As shown, memory tag circuitry 131 and overlying metallization layers 531 are embedded within dielectric material layers 542, 545.

A number of memory cells 109 are over and coupled to transistors 501 of memory tag circuitry 131. Each of memory cells 109 includes a select transistor 118 and a capacitor 119, as discussed herein. Memory cells 109 are arrayed in the x-y plane in a grid or similar pattern such that particular ones of memory cells 109 are coupled to word lines 125 and bit lines 135. Each of word lines 125 extends, for example, in the x-direction, and is coupled to a number of gate electrodes of corresponding select transistors 118. Each of bit lines 135 extends, for example, in the y-direction, and is coupled to a number of source contacts of other ones of select transistors 118. Each of memory cells 109 includes a capacitor 119 coupled to a drain contact of its corresponding select transistor 118 such that a 1T-1C architecture is achieved with each select transistor contacted at a gate electrode by a word line, at a source electrode by a bit line, and a drain electrode by a capacitor.

Transistors 501, memory cells 109 and routing to an outside device (not shown), is provided by metallization layers 531. As used herein, the term metallization layer indicates metal interconnections or wires that provide electrical routing. Adjacent metallization layers are interconnected by vias that may be characterized as part of the metallization layers or between the metallization layers. As shown, in some embodiments, first metallization layers M1-M5 (lower metallization layers) are formed over and immediately adjacent transistors 501 and second metallization layers M6-M11 (higher metallization layers) are formed over and first metallization layers M1-M5 such that some of second metallization layers M6-M11 are laterally adjacent memory cells 109. For example, memory cells 109 are within the stack of second metallization layers M6-M11. Such architectures provide for close integration of memory tag circuitry 131 and the array of memory cells 109.

Notably, one or more of metallization layers 531 are laterally aligned with at least portions of memory cells 109 while others of metallization layers 531 are over (e.g., vertically aligned with memory cells 109). Furthermore, some of metallization layers 531 are between transistors 501 and memory cells 109 such that none of metallization layers 531 are below transistors 501. Notably, one or two of metallization layers 531 may be between transistors 501 and memory cells 109. In the illustrated example, M5 provides word line 125 and, optionally, other interconnects of memory device 100. Furthermore, another one of metallization layers 531 (M6) is over transistors 501 and below capacitors 119 with M6 being in contact with the source gate of select transistors 118. For example, M6 provides bit line 135 and, optionally, other interconnects of memory device 100.

In the illustrated example, lower metallization layers of metallization layers 531 include V0, M1, V1, M2, V2, M3, V3, and M4 (i.e., four metallization layers and corresponding via layers) and upper metallization layers of metallization layers 531 V4, M5, V5, M6, V6, M7, V7, M8, V8, M9, V9, M10, V10, and M11 (e.g., a bump or pad layer). However, the lower and upper metallization layers may include any number of metallization layers.

As discussed, the architecture of memory device 100 inclusive of transistors 501 and memory cells 109 embedded in metallization layers 531 such that a monolithic memory device is provided that includes DRAM cells 109, memory tag circuitry 131 as implemented by transistors 181, advantageously provides an efficient and compact monolithic memory solution. As shown in FIG. 1, memory device 500 may be provided as a monolith integrated DRAM and memory tag circuitry die 582. In some embodiments, memory device 100 is, or is implemented as a portion of, a memory system such that the system includes monolith integrated DRAM and memory tag circuitry die 582 coupled to a second monolith integrated circuit die or a substrate (i.e., a package substrate). As discussed, monolith integrated DRAM and memory tag circuitry die 582 includes an array of DRAM cells 109 in a first lateral plane over memory tag circuitry 131. In such embodiments, the second monolith integrated circuit die or substrate may provide support circuitry as discussed herein.

In other embodiments, such support circuitry is instead integrated with DRAM cells 109 on a first integrated circuit die and memory tag circuitry 131 is provided in a second integrated circuit die and the first and second integrated circuit dies are die stack bonded to provide memory tag circuitry 131 in vertical alignment with DRAM cells 109. Such embodiments are discussed further herein below.

Figure 6:
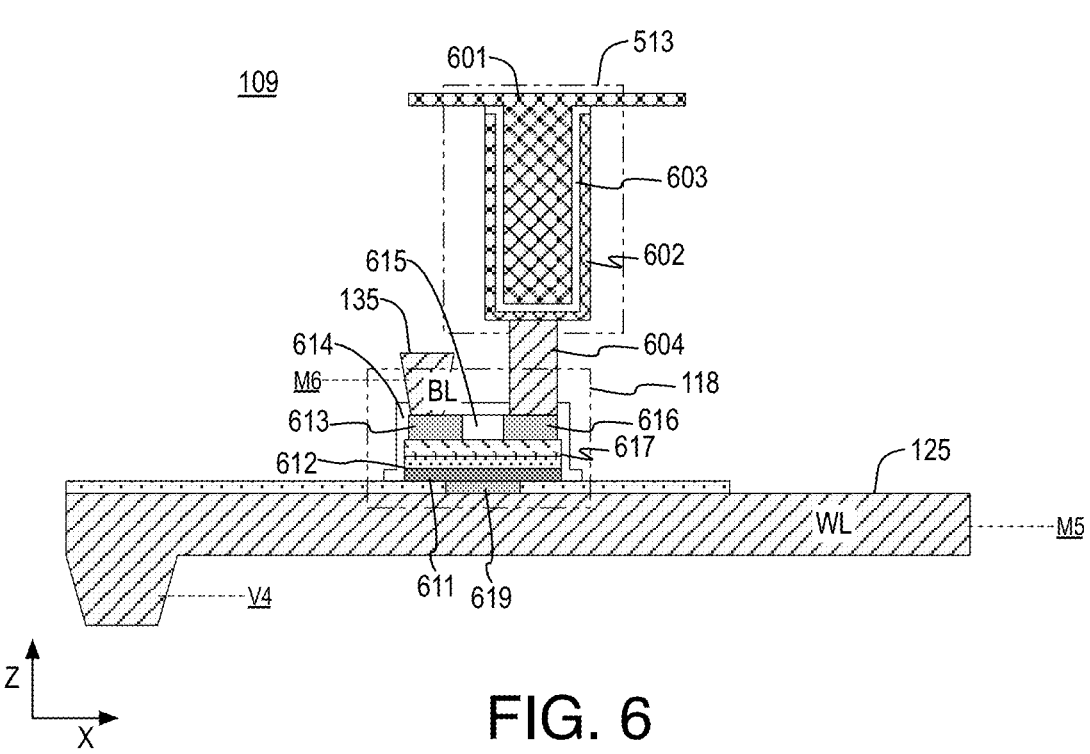
FIG. 6 illustrates an exemplary memory cell provided over memory tag circuitry.

FIG. 6 illustrates an exemplary memory cell 109 provided over memory tag circuitry, arranged in accordance with at least some implementations of the present disclosure. In FIG. 6, memory cell 109 is illustrated in parallel to gate view 591. Each select transistor 118 includes a semiconductor channel layer 617. Channel layer 617 may be any suitable semiconductor material such as an amorphous (i.e., having no structural order) film or a polycrystalline (i.e., having micro-scale to nano-scale crystal grains) film. In some embodiments, select transistor 118 may be characterized as a thin film transistor (TFT). Select transistors 118 may deploy any suitable thin film semiconductor material for channel layer 617 including group IV semiconductor materials such as silicon (Si), germanium (Ge), and SiGe alloys, or an oxide semiconductor. An oxide semiconductor is a semiconducting oxide, or a semiconductor comprising oxygen, which may provide a wide band gap material having low leakage. For example, the metal oxide may include at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Each select transistor 118 include a gate electrode 611 (e.g., metal gate) separated from channel layer 617 by a gate dielectric 612. Gate electrode 611 is connected to word line 125 by a word line to metal gate via 619. In the exemplary embodiments herein, select transistors 118 are back gate devices with gate dielectric 612 fabricated over gate electrode 611. A dielectric spacer 615 separates source and drain contacts 613, 616, which contact a top surface of channel layer 617. A source contact 613 is coupled to bit line 135 (i.e., part of M6 of metallization layers 531) and a drain contact 616 is coupled to a local interconnect 604, which is also connected to an outer plate 602 of capacitor 119. Source and drain contacts 613, 616 are separated by a dielectric spacer 615. A conformal dielectric layer 614 may protect portions of select transistor 118.

Capacitor 119 (e.g., a storage capacitor) includes outer plate 602 (or terminal) and inner plate 601 (or terminal) separated by a dielectric layer 603 such that outer plate 602 is electrically coupled drain contact 616 (i.e., a semiconductor terminal) of select transistor 118. Inner plate 601 (or second terminal) of capacitor 119 may be connected to another circuit node as provides by V6/M7 of metallization layers 531. Inner and outer plates 601, 602 may be any suitable conductive materials such as such as a metal (e.g., copper, cobalt, tungsten, titanium, aluminum, ruthenium, etc.). Dielectric layer 603 may be any dielectric material having a suitable relative permittivity. For example, dielectric layer 603 may be silicon oxide, aluminum oxide, or a high-k dielectric, such as hafnium oxide. More generally, dielectric layer 603 may include elements such as hafnium, silicon, oxygen, titanium, tantalum, lanthanum, aluminum, zirconium, barium, strontium, yttrium, lead, scandium, niobium, and zinc. Examples of materials that may be used in dielectric layer 603 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, dielectric layer 603 may be a multi-layer gate dielectric including multiple different materials.

In some embodiments, layer 603 is a ferroelectric material. As used herein, the term ferroelectric material indicates a material that has a spontaneous electric polarization that may be controlled by the application of an external electric field. In some embodiments, layer 603 includes lead, zirconium, titanium, and oxygen (e.g., lead zirconium titanate, $Pb[Zr_xTi_{1-x}]O_3$) In some embodiments, layer 603 includes barium, titanium, and oxygen (e.g., barium titanate, $BaTiO_3$). In some embodiments, layer 603 includes lead, titanium, and oxygen (e.g., lead titanate, $PbTiO_3$). In some embodiments, layer 603 includes barium, strontium, titanium, and oxygen (e.g., barium strontium titanate, $BaSrTiO_3$). Other ferroelectric materials may be employed.

With reference to FIGS. 1, 2, and 5, a memory device includes memory tag circuitry 131 including a number of field effect transistors (FETs) (transistors 501) such that individual ones of transistors 501 include channel structure 506, gate electrode 505, and gate dielectric layer 504 between channel structure 506 and gate electrode 505. The memory device also includes an array of memory cells 109 over and monolithically integrated with memory tag circuitry 131 via, at least in part, a number of metallization layers 531 such that individual ones of memory cells 109 include a select transistor 118 and a capacitor 119.

Figure 7:
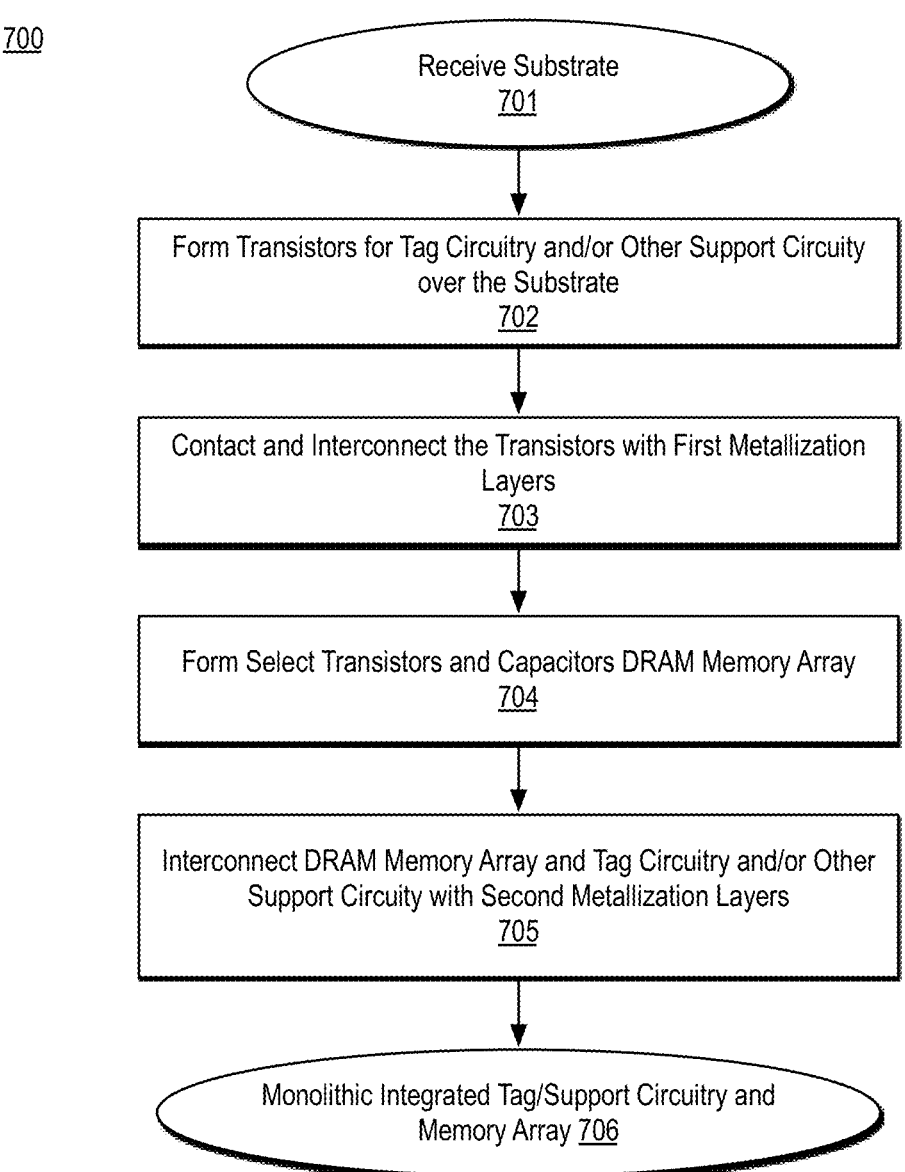
FIG. 7 illustrates a flow diagram illustrating an example process for fabricating memory device structures.

FIG. 7 illustrates a flow diagram illustrating an example process 700 for fabricating memory device structures, arranged in accordance with at least some implementations of the present disclosure. For example, process 700 may be implemented to fabricate memory device 500 or other memory device structures discussed herein. In the illustrated embodiment, process 700 includes one or more operations as illustrated by operations 701-706. However, embodiments herein may include additional operations, certain operations being omitted, or operations being performed out of the order provided.

Process 700 begins at operation 701, where a substrate is received for processing. The substrate may include a semiconductor layer, upon which transistors may be formed. Alternatively, the substrate may advantageously include a work surface on which transistors are formed. Processing continues at operation 702, where transistors for memory tag circuitry and/or memory support circuitry are formed over the substrate. The transistors may be formed using any suitable technique or techniques known in the art. In some examples, both n-type and p-type transistors are fabricated at operation 702 for eventual interconnection into CMOS support or control circuitry. In some embodiments, the transistors provide memory tag circuitry that may be integrated with overlying DRAM cells. In such embodiments, the operations of process 1100 may be used to couple the IC die including DRAM and memory tag circuitry to another IC die or substrate that implements support circuitry. In other embodiments, the transistors provide support circuitry that is integrated with overlying DRAM cells. In such embodiments, the operations of process 1100 are used to couple the IC die including DRAM and support circuitry to another IC die that implements memory tag circuitry. For example, with reference to FIG. 5, transistors 501 may be formed on and/or over substrate 541 at operation 702.

Processing continues at operation 703, where the transistors formed at operation 702 are at least partially interconnected with lower metallization layers. In some embodiments, the lower metallization layers include four metallization layers (M1-M4) and corresponding via structures. For example, with reference to FIG. 5, metallization layers M1-M5, corresponding via structures V0-V4, and corresponding dielectric layers may be formed over transistors 501 at operation 703. The lower metallization layers may be formed using any suitable technique or techniques such as dual or single damascene techniques or the like.

Processing continues at operation 704, where the select transistors and capacitors (e.g., a thin film transistors and MIM capacitors memory array is formed). It is noted that operations 704, 705 may be combined in part such that the formation of the select transistors and capacitors and at least portions of the laterally adjacent metallization layers are formed in parallel and in shared operations. The select transistors and capacitors may be formed using any suitable technique or techniques. As discussed herein, the select transistors and capacitors may be fabricated within BEOL metallization layers. In some embodiments, the select transistors are fabricated in a metallization layer over the support circuitry and the MIM capacitors are fabricated in a metallization layer over the select transistors. In some embodiments, the select transistors are interconnected to the capacitors and adjacent circuitry with vias and traces fabricated at these same metallization layers to form a memory array. For example, with reference to FIG. 5, memory cells 109 may be formed over metallization layers M1-M5, corresponding via structures V0-V4, and the corresponding dielectric layers at operation 704.

Processing continues at operation 705, where upper metallization layers are formed. For example, vias and a metallization layer including interconnect traces for the memory cells and other circuitry, as well as to couple the memory device to the system in which it is being deployed, may be formed. For example, with reference to FIG. 5, metallization layers M7-M11, corresponding via structures V7-V10, and corresponding dielectric layers may be formed over memory cells 109 at operation 705. The upper metallization layers may be formed using any suitable technique or techniques such as dual or single damascene techniques or the like.

Processing continues at operation 706, where the fabricated monolithic integrated logic circuitry (i.e., memory tag circuitry and/or support circuitry) and DRAM array formed via operations 701-705 is output. The monolithic integrated logic circuitry may be further processed and/or packaged in preparation for insertion in a final system or device, as discussed herein below. The memory device formed via process 700 may integrated into any suitable electronics device.

Figures 8, 9, 10:
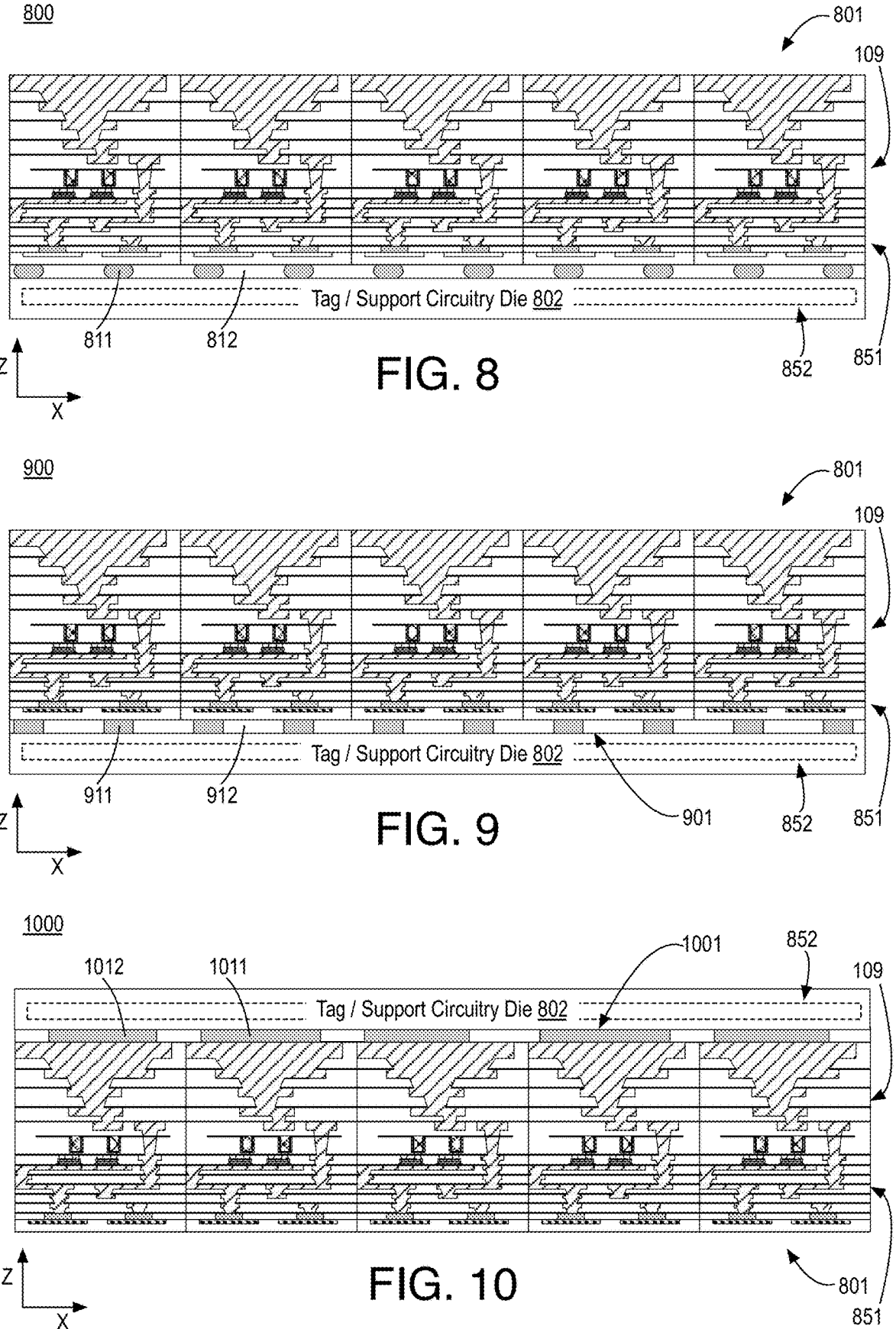
FIG. 8 illustrates an exemplary memory system including vertically aligned dynamic random access memory array, memory tag circuitry, and support circuitry.
FIG. 9 illustrates another exemplary memory system including vertically aligned dynamic random access memory array, memory tag circuitry, and support circuitry.
FIG. 10 illustrates an exemplary memory system including vertically aligned dynamic random access memory array, memory tag circuitry, and support circuitry using back-side bonding.

FIG. 8 illustrates an exemplary memory system 800 including vertically aligned dynamic random access memory array, memory tag circuitry, and support circuitry, arranged in accordance with at least some implementations of the present disclosure. In FIGS. 8, 9, and 10, a first monolithic integrated circuit die 801 is illustrated that includes an array of DRAM cells 109 over transistor circuitry 851. As discussed herein, one or both of tag circuitry modules 131, 132 and/or support circuitry modules 111, 112, 113, 114, 115 may be implemented via transistor circuitry 851 such that transistor circuitry 851 and DRAM cells 109 are provided in the same monolithic IC die 801. Monolithic IC die 801 is coupled to a second monolithic IC die 802 that may include a transistor layer 852 to implement, one or both of tag circuitry modules 131, 132 and/or support circuitry modules 111, 112, 113, 114, 115.

In some embodiments, transistor circuitry 851 of monolithic IC die 801 implements one or both of tag circuitry modules 131, 132. For example, memory system 800 may include an array of DRAM cells 109 in a first lateral plane and memory tag circuitry 131, 132 integrated with DRAM cells 109 in the same monolithic IC die 801 with memory tag circuitry 131, 132 in a second lateral plane such that DRAM cells 109 and one or both of memory tag circuitry 131, 132 are vertically aligned. Monolithic IC die 801 may then be coupled to second monolithic IC die 802 that deploys support circuitry via transistor layer 852 and/or metallization routing. In such embodiments, DRAM storage and SRAM tag circuitry are integrated in the same monolithic IC die 801. Furthermore, second monolithic IC die 802 that deploys support circuitry (i.e., support circuitry modules 111, 112, 113, 114, 115) and/or metallization routing and monolithic IC die 801 are also vertically aligned.

Alternatively, in some embodiments, transistor circuitry 851 of monolithic IC die 801 implements one or more of support circuitry modules 111, 112, 113, 114, 115. For example, memory system 800 may include an array of DRAM cells 109 in a first lateral plane and one or more of support circuitry modules 111, 112, 113, 114, 115 integrated with DRAM cells 109 in the same monolithic IC die 801 with one or more of support circuitry modules 111, 112, 113, 114, 115 in a second lateral plane such that DRAM cells 109 and one or more of support circuitry modules 111, 112, 113, 114, 115 are vertically aligned. Monolithic IC die 801 may then be coupled to second monolithic IC die 802 that deploys memory tag circuitry 131, 132 via transistor layer 852 and/or metallization routing. In such embodiments, DRAM storage and SRAM tag circuitry are integrated using two monolithic IC dies 801, 802. Furthermore, the second monolithic IC die 802 that deploys one or both of memory tag circuitry 131, 132 and/or metallization routing and monolithic IC die 801 are also vertically aligned.

As shown in FIG. 8, in some embodiments, monolithic IC die 801 and monolithic IC die 802 (or a passive substrate) are coupled via bump structures 811 that are distributed between monolithic IC die 801 and monolithic IC die 802. Such bump structures 811 may be implemented using any suitable technique or techniques such as bump bonding techniques deploying any suitable materials such as solder materials or the like. In some embodiments, bump structures 811 are encapsulated by a dielectric sealant or underfill material 812.

FIG. 9 illustrates another exemplary memory system 900 including vertically aligned dynamic random access memory array, memory tag circuitry, and support circuitry, arranged in accordance with at least some implementations of the present disclosure. Memory system 900 may utilize monolithic IC die 801 and monolithic IC die 802 having any characteristics discussed with respect to FIG. 8, with memory system 900 deploying a hybrid bond 901 to bond monolithic IC die 801 to monolithic IC die 802.

Hybrid bond 901, including metallization structures 911 and dielectric material 912 may be formed using any suitable technique or techniques. In some embodiments, matching metallization structures are formed on both monolithic IC die 801 and monolithic IC die 802 such that on each of monolithic IC dies 801, 802, the metallization structures are embedded within dielectric material. Monolithic IC dies 801, 802 may then be brought into contact such that the respective metallization structures and dielectric materials on each of monolithic IC dies 801, 802 are coupled to one another. The hybrid bonding between monolithic IC dies 801, 802 may then begin via attractive forces between the dielectric materials holding monolithic IC dies 801, 802 together. Pressure and heat may then be applied to provide inter-diffusion between the metals of the metallization structures to form metallization structures 911 of hybrid bond 901. Such bonding techniques may be performed between monolithic IC dies 801, 802 with one or both being provided as part of a wafer of many such dies. That is, such techniques may be performed at the wafer level (i.e., wafer to wafer bonding or die to wafer bonding) or at the die level (i.e., die to die bonding).

As shown, such techniques provide vertical alignment, as with memory system 800, for an array of DRAM cells 109 and one or both of memory tag circuitry 131, 132 (as implemented by transistor circuitry 851 of monolithic IC die 801 or transistor layer 852 monolithic IC die 802. One or more of support circuitry modules 111, 112, 113, 114, 115 may then be deployed via the other of transistor circuitry 851 of monolithic IC die 801 or transistor layer 852 monolithic IC die 802.

FIG. 10 illustrates an exemplary memory system 1000 including vertically aligned dynamic random access memory array, memory tag circuitry, and support circuitry using back-side bonding, arranged in accordance with at least some implementations of the present disclosure. Memory system 1000 may utilize monolithic IC die 801 and monolithic IC die 802 having any characteristics discussed with respect to FIG. 8, with memory system 1000 deploying a hybrid bond 1001 to bond monolithic IC die 802 to a back side of monolithic IC die 801.

Although illustrated with respect to hybrid bond 1001 including metallization structures 1011 within dielectric material 1012, memory system 1000 may deploy bump bonding techniques as illustrated with respect to memory system 800. As shown in FIG. 10, monolithic IC die 802 is arranged vertically aligned with and over monolithic IC die 801. In some embodiments, one or both of memory tag circuitry 131, 132 is deployed in monolithic IC die 802 such that memory tag circuitry 131, 132 is over array of DRAM cells 109. One or more of support circuitry modules 111, 112, 113, 114, 115 is implemented in transistor circuitry 851 such that array of DRAM cells 109 is between one or both of memory tag circuitry 131, 132 and one or more of support circuitry modules 111, 112, 113, 114, 115 and such that DRAM cells 109 and one or more of support circuitry modules 111, 112, 113, 114, 115 are in the same monolithic IC die 802.

Alternatively, one or more of support circuitry modules 111, 112, 113, 114, 115 is deployed in monolithic IC die 802 and memory tag circuitry 131, 132 is implemented in monolithic IC die 801 such that array of DRAM cells 109 is between one or both of memory tag circuitry 131, 132 and one or more of support circuitry modules 111, 112, 113, 114, 115 and such that DRAM cells 109 and one or both of memory tag circuitry 131, 132 are in the same monolithic IC die 802.

Figure 11:
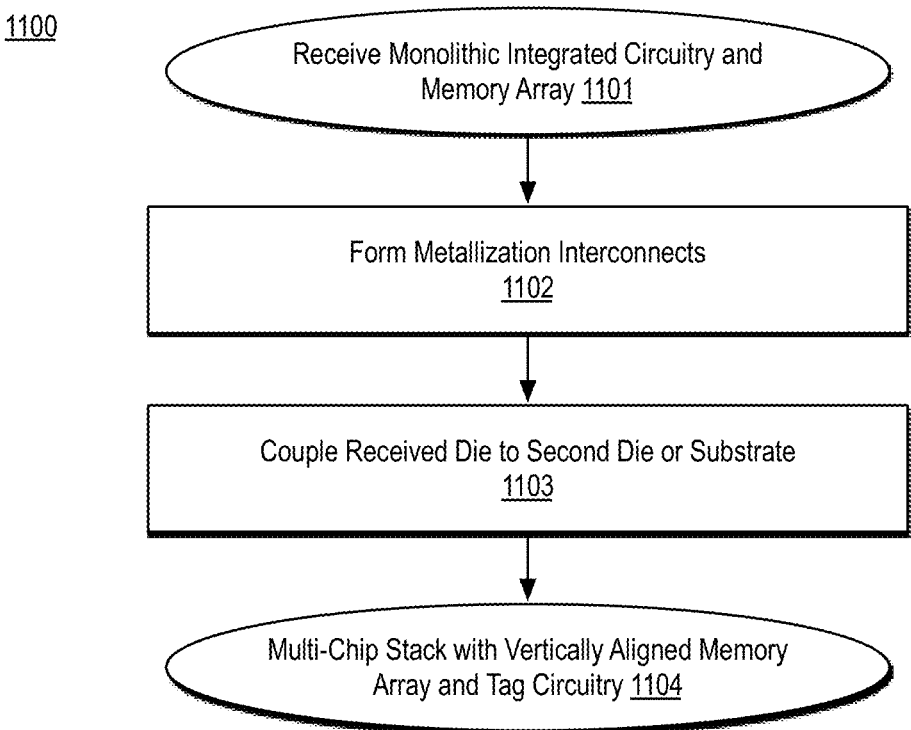
FIG. 11 illustrates a flow diagram illustrating an example process for assembling memory device structures.

FIG. 11 illustrates a flow diagram illustrating an example process 1100 for assembling memory device structures, arranged in accordance with at least some implementations of the present disclosure. For example, process 1100 may be implemented to fabricate memory systems 800, 900, 1000 or other memory device structures discussed herein. In the illustrated embodiment, process 1100 includes one or more operations as illustrated by operations 1101-1104. However, embodiments herein may include additional operations, certain operations being omitted, or operations being performed out of the order provided.

Process 1100 begins at operation 1101, where a monolithic integrated circuit die is received for processing. The monolithic integrated circuit die includes an array of DRAM cells arrayed in a first lateral plane and optional memory circuitry arrayed in a second lateral plane vertically offset with respect to the first lateral plane such that the array of DRAM cells and the memory circuitry (i.e., as implemented by a transistor layer) are vertically aligned. As discussed, the memory circuitry may include tag circuitry (such that the array of DRAM cells and memory tag circuitry are implemented in the same monolithic IC die) or support circuitry (such that the array of DRAM cells and support circuitry are implemented in the same monolithic IC die, while the tag circuitry is implemented in a second monolithic IC die). The monolithic integrated circuit die may be fabricated using any suitable technique or techniques such as those discussed with respect to process 700.

Processing continues at operation 1102, where metallization interconnects are formed on the received monolithic integrated circuit die in preparation for die to die or die to substrate bonding. The metallization interconnects may be bump structures, hybrid bonding structures, or other metallization structures. Such metallization interconnects may be formed on the monolithic integrated circuit die received at operation 1101, on the monolithic integrated circuit die to which it is to be coupled (as received at operation 1103), or both.

Processing continues at operation 1103, where the IC die received at operation 1101 is coupled to a second IC die optionally having circuitry absent from the IC die received at operation 1101. In embodiments where the IC die received at operation 1101 has on-board memory tag circuitry, it may be coupled to a second IC die having support circuitry or to a substrate (i.e., package substrate) having metallization routing or the like. In embodiments where the IC die received at operation 1101 does not include memory tag circuitry (i.e., it includes other support circuitry), it may be coupled to a second IC die having memory tag circuitry. The IC die may be attached to the second IC die or substrate using any suitable technique or techniques such as bump coupling, hybrid bonding, or the like.

Processing continues at operation 1104, where the fabricated IC die stack or IC to die substrate system formed via operations 1101-1103 is output. The integrated memory device includes an array of DRAM cells vertically aligned with memory tag circuitry such that the memory tag circuitry is in the same monolithic IC die or in a separate IC die vertically stacked with the IC die including the array of DRAM cells.

Figure 12:
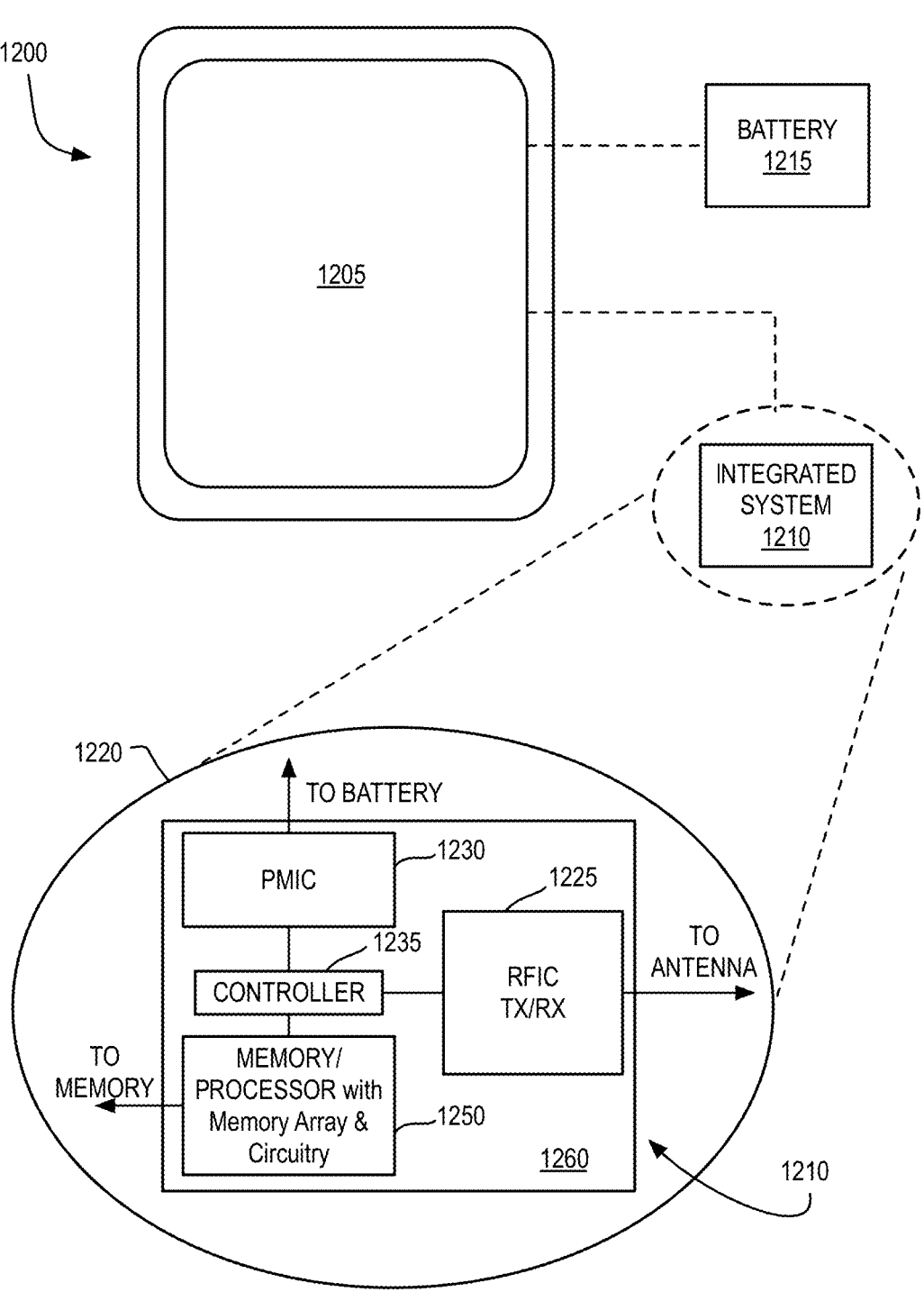
FIG. 12 is an illustrative diagram of a mobile computing platform employing a memory device having an array of dynamic random access memory cells and integrated memory tag circuitry.

FIG. 12 is an illustrative diagram of a mobile computing platform 1200 employing a memory device having an array of dynamic random access memory cells and integrated memory tag circuitry, arranged in accordance with at least some implementations of the present disclosure. Any die or system having a structure inclusive of any components, materials, or characteristics discussed herein may be implemented by any component of mobile computing platform 1200. For example, one or more memory devices having an array of DRAM cells and integrated memory tag circuitry (either on the same monolithic IC die or integrated using a vertical die stack) with any related characteristics discussed herein may be deployed by any component of mobile computing platform 1200. Mobile computing platform 1200 may be any portable device configured for each of electronic data display, electronic data processing, wireless electronic data transmission, or the like. For example, mobile computing platform 1200 may be any of a tablet, a smart phone, a netbook, a laptop computer, etc. and may include a display screen 1205, which in the exemplary embodiment is a touchscreen (e.g., capacitive, inductive, resistive, etc. touchscreen), a chip-level (system on chip—SoC) or package-level integrated system 1210, and a battery 1215. Battery 1215 may include any suitable device for providing electrical power such as a device consisting of one or more electrochemical cells and electrodes to couple to an outside device. Mobile computing platform 1200 may further include a power supply to convert a source power from a source voltage to one or more voltages employed by other devices of mobile computing platform 1200.

Integrated system 1210 is further illustrated in the expanded view 1220. In the exemplary embodiment, packaged device 1250 (labeled "Memory/Processor" in FIG. 12) includes at least one memory chip (e.g., RAM), and/or at least one processor chip (e.g., a microprocessor, a multi-core microprocessor, or graphics processor, or the like). In an embodiment, the package device 1250 is a microprocessor including an SRAM cache memory. As shown, device 1250 may employ a die or device having any transistor structures and/or related characteristics discussed herein. Packaged device 1250 may be further coupled to (e.g., communicatively coupled to) a board, a substrate, or an interposer 1260 along with, one or more of a power management integrated circuit (PMIC) 1230, RF (wireless) integrated circuit (RFIC) 1225 including a wideband RF (wireless) transmitter and/or receiver (TX/RX) (e.g., including a digital baseband and an analog front end module further comprises a power amplifier on a transmit path and a low noise amplifier on a receive path), and a controller 1235 thereof. In general, packaged device 1250 may be also be coupled to (e.g., communicatively coupled to) display screen 1205. As shown, one or both of PMIC 1230 and/or RFIC 1225 may employ a die or device having any transistor structures and/or related characteristics discussed herein.

Functionally, PMIC 1230 may perform battery power regulation, DC-to-DC conversion, etc., and so has an input coupled to battery 1215 and with an output providing a current supply to other functional modules. In an embodiment, PMIC 1230 may perform high voltage operations. As further illustrated, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1250 or within a single IC (SoC) coupled to the package substrate of the packaged device 1250.

Figure 13:
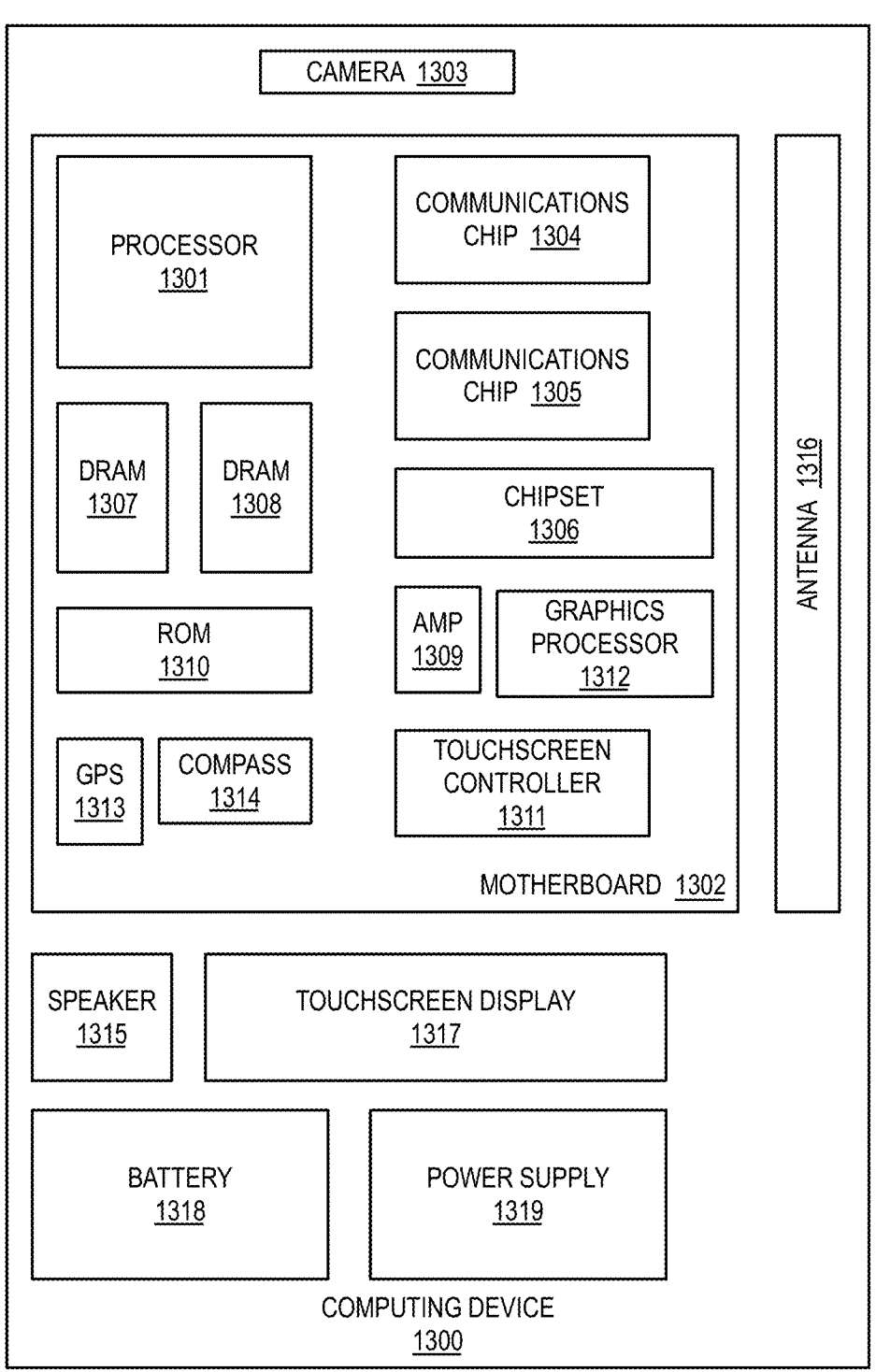
FIG. 13 is a functional block diagram of a computing device, all arranged in accordance with at least some implementations of the present disclosure.

FIG. 13 is a functional block diagram of a computing device 1300, arranged in accordance with at least some implementations of the present disclosure. Computing device 1300 may be found inside platform 1200, for example, and further includes a motherboard 1302 hosting a number of components, such as but not limited to a processor 1301 (e.g., an applications processor) and one or more communications chips 1304, 1305. Processor 1301 may be physically and/or electrically coupled to motherboard 1302. In some examples, processor 1301 includes an integrated circuit die packaged within the processor 1301. In general, the term "processor" may refer to any device or portion of a device that processes electronic data from registers and/or memory to transform that electronic data into other electronic data that may be stored in registers and/or memory. Any one or more device or component of computing device 1300 may include a memory device having an array of DRAM cells and integrated memory tag circuitry (either on the same monolithic IC die or integrated using a vertical die stack) with any related characteristics discussed herein.

In various examples, one or more communication chips 1304, 1305 may also be physically and/or electrically coupled to the motherboard 1302. In further implementations, communication chips 1304 may be part of processor 1301. Depending on its applications, computing device 1300 may include other components that may or may not be physically and electrically coupled to motherboard 1302. These other components may include, but are not limited to, volatile memory (e.g., DRAM) 1307, 1308, non-volatile memory (e.g., ROM) 1310, a graphics processor 1312, flash memory, global positioning system (GPS) device 1313, compass 1314, a chipset 1306, an antenna 1316, a power amplifier 1309, a touchscreen controller 1311, a touchscreen display 1317, a speaker 1315, a camera 1303, a battery 1318, and a power supply 1319, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1304, 1305 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1304, 1305 may implement any of a number of wireless standards or protocols, including but not limited to those described elsewhere herein. As discussed, computing device 1300 may include a plurality of communication chips 1304, 1305. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1319 may convert a source power from a source voltage to one or more voltages employed by other devices of computing device 1300 (or mobile computing platform 1200). In some embodiments, power supply 1319 converts an AC power to DC power. In some embodiments, power supply 1319 converts an DC power to DC power at one or more different (lower) voltages. In some embodiments, multiple power supplies are staged to convert from AC to DC and then from DC at a higher voltage to DC at a lower voltage as specified by components of computing device 1300.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, a memory device comprises an array of dynamic random access memory cells in a first lateral plane, individual ones of the dynamic random access memory cells of the array comprising a select transistor and a capacitor structure and memory tag circuitry integrated with the array of memory cells, the memory tag circuitry comprising a plurality of static random access memory cells in a second lateral plane vertically offset with respect to the first lateral plane, the memory tag circuitry and the array of dynamic random access memory cells vertically aligned In one or more second embodiments, further to the first embodiment the memory tag circuitry is to determine a received memory address is valid, and, in response to being validated, signal the dynamic random access memory cells to retrieve data corresponding to the received memory address.

In one or more third embodiments, further to the first or second embodiments, individual ones of the static random access memory cells comprise a plurality of transistors, individual ones of the plurality of transistors connected to the array of dynamic random access memory cells by a plurality of metallization layers, wherein the static random access memory cells, the array of dynamic random access memory cells, and the plurality of metallization layers comprise a monolithic integrated circuit die.

In one or more fourth embodiments, further to any of the first through third embodiments, the individual ones of the plurality of transistors comprise a channel structure substantially parallel to the second lateral plane.

In one or more fifth embodiments, further to any of the first through fourth embodiments, the plurality of metallization layers comprise a plurality of first metallization layers between the plurality of transistors and the array of dynamic random access memory cells and a plurality of second metallization layers over and laterally adjacent the array of dynamic random access memory cells.

In one or more sixth embodiments, further to any of the first through fifth embodiments, the apparatus further comprises a second integrated circuit die coupled to and in vertical alignment with the monolithic integrated circuit die, the second integrated circuit die comprising memory support circuitry.

In one or more seventh embodiments, further to any of the first through sixth embodiments, the individual ones of the static random access memory cells comprise one of a six-transistor static random access memory cell having cross-coupled inverters or a six-transistor static random access memory cell and a plurality of comparison transistors.

In one or more eighth embodiments, further to any of the first through seventh embodiments, the array of dynamic random access memory cells comprises at least a portion of a first monolithic integrated circuit die and the memory tag circuitry comprises at least a portion of a second monolithic integrated circuit die coupled to the first monolithic integrated circuit die.

In one or more ninth embodiments, further to any of the first through eighth embodiments, the first monolithic integrated circuit die and the second monolithic integrated circuit die are bonded by bump structures therebetween.

In one or more tenth embodiments, further to any of the first through ninth embodiments, the first monolithic integrated circuit die and the second monolithic integrated circuit die are hybrid bonded by metallization structures therebetween and dielectric material between individual ones of the metallization structures.

In one or more eleventh embodiments, further to any of the first through tenth embodiments, the first monolithic integrated circuit die further comprises support circuitry vertically aligned with the array of dynamic random access memory cells and the memory tag circuitry, the support circuitry comprising a plurality of transistors, individual ones of the plurality of transistors connected to the array of dynamic random access memory cells by a plurality of metallization layers.

In one or more twelfth embodiments, further to any of the first through eleventh embodiments, the support circuitry is vertically between the array of dynamic random access memory cells and the memory tag circuitry.

In one or more embodiments, a system comprises a power supply and an integrated circuit die coupled to the power supply, the integrated circuit die comprising a memory device according to any of the first through twelfth embodiments.

In one or more thirteenth embodiments, a system comprises a first monolithic integrated circuit die comprising an array of dynamic random access memory cells in a first lateral plane, individual ones of the dynamic random access memory cells of the array comprising a select transistor and a capacitor structure and memory tag circuitry integrated with the array of memory cells, the memory tag circuitry comprising a plurality of static random access memory cells in a second lateral plane vertically offset with respect to the first lateral plane, individual ones of the static random access memory cells comprising a plurality of transistors, wherein the memory tag circuitry and the array of dynamic random access memory cells are vertically aligned, a second monolithic integrated circuit die or a substrate coupled to the first monolithic integrated circuit die, wherein the first monolithic integrated circuit die and the second monolithic integrated circuit die or the substrate are vertically aligned, and a power supply coupled to the first monolithic integrated circuit die.

In one or more fourteenth embodiments, further to the thirteenth embodiment, individual ones of the plurality of transistors comprise a channel structure substantially parallel to the second lateral plane.

In one or more fifteenth embodiments, further to the thirteenth or fourteenth embodiments, individual ones of the plurality of transistors are connected to the array of dynamic random access memory cells by a plurality of metallization layers, the plurality of metallization layers comprising a plurality of first metallization layers between the plurality of transistors and the array of dynamic random access memory cells and a plurality of second metallization layers over and laterally adjacent the array of dynamic random access memory cells.

In one or more sixteenth embodiments, further to any of the thirteenth through fifteenth embodiments, the first monolithic integrated circuit die and the second monolithic integrated circuit die or the substrate are coupled by one of bump structures therebetween or by hybrid bonding by metallization structures therebetween and dielectric material between individual ones of the metallization structures.

In one or more seventeenth embodiments, further to any of the thirteenth through sixteenth embodiments, the memory tag circuitry is to receive a memory address, determine the memory address is a valid memory address, and, in response to being validated, signal the dynamic random access memory cells to retrieve data corresponding to the received memory address.

In one or more eighteenth embodiments, a system comprises a first monolithic integrated circuit die comprising an array of dynamic random access memory cells in a first lateral plane, individual ones of the dynamic random access memory cells of the array comprising a select transistor and a capacitor structure and support circuitry integrated with the array of memory cells, the support circuitry comprising a plurality of first transistors in a second lateral plane vertically offset with respect to the first lateral plane, wherein the support circuitry and the array of dynamic random access memory cells are vertically aligned, a second monolithic integrated circuit die coupled to the first monolithic integrated circuit die, the second monolithic integrated circuit die comprising memory tag circuitry, the memory tag circuitry comprising a plurality of static random access memory cells, individual ones of the static random access memory cells comprising a plurality of second transistors, wherein the first monolithic integrated circuit die and the second monolithic integrated circuit die are vertically aligned, and a power supply coupled to the first monolithic integrated circuit die and the second monolithic integrated circuit die.

In one or more nineteenth embodiments, further to the eighteenth embodiment, the first monolithic integrated circuit die and the second monolithic integrated circuit die are bonded by bump structures therebetween.

In one or more twentieth embodiments, further to the eighteenth or nineteenth embodiments, the first monolithic integrated circuit die and the second monolithic integrated circuit die are hybrid bonded by metallization structures therebetween and dielectric material between individual ones of the metallization structures.

In one or more twenty-first embodiments, further to any of the eighteenth through twentieth embodiments, the first monolithic integrated circuit die further comprises support circuitry vertically aligned with the array of dynamic random access memory cells and the memory tag circuitry, the support circuitry comprising a plurality of transistors, individual ones of the plurality of transistors connected to the array of dynamic random access memory cells by a plurality of metallization layers.

In one or more twenty-second embodiments, further to any of the eighteenth through twenty-first embodiments, the support circuitry is vertically between the array of dynamic random access memory cells and the memory tag circuitry.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A memory device, comprising:

an array of dynamic random access memory cells in a first lateral plane and within a first region of the first lateral plane, individual ones of the dynamic random access memory cells of the array comprising a select transistor and a capacitor structure; and memory tag circuitry integrated with the array of memory cells, the memory tag circuitry comprising a plurality of static random access memory cells in a second lateral plane vertically offset with respect to the first lateral plane and within a second region of the second lateral plane, the second region defined by and within a shadow of the first region, wherein the memory tag circuitry and the array of dynamic random access memory cells are vertically aligned, the second region of the second lateral plane comprises only the memory tag circuitry and no other circuitry, and wherein a monolithic integrated circuit die comprises the static random access memory cells and the array of dynamic random access memory cells.

2. The memory device of claim 1, wherein the memory tag circuitry is to determine a received memory address is valid, and, in response to being validated, signal the dynamic random access memory cells to retrieve data corresponding to the received memory address.

3. The memory device of claim 1, wherein individual ones of the static random access memory cells comprise a plurality of transistors, and individual ones of the plurality of transistors are connected to the array of dynamic random access memory cells by a plurality of metallization layers, wherein the monolithic integrated circuit die comprises the plurality of metallization layers.

4. The memory device of claim 3, wherein the individual ones of the plurality of transistors each comprise a channel structure substantially parallel to the second lateral plane.

5. The memory device of claim 3, wherein the plurality of metallization layers comprise a plurality of first metallization layers between the plurality of transistors and the array of dynamic random access memory cells and a plurality of second metallization layers over and laterally adjacent the array of dynamic random access memory cells.

6. The memory device of claim 1, further comprising a second monolithic integrated circuit die coupled to and in vertical alignment with the monolithic integrated circuit die, the second monolithic integrated circuit die comprising memory support circuitry.

7. The memory device of claim 6, wherein the monolithic integrated circuit die and the second monolithic integrated circuit die are coupled by bump structures therebetween.

8. The memory device of claim 6, wherein the monolithic integrated circuit die and the second monolithic integrated circuit die are coupled by hybrid bonding by metallization structures therebetween and dielectric material between individual ones of the metallization structures.

9. The memory device of claim 8, wherein the dynamic random access memory cells are between the memory tag circuitry and the second monolithic integrated circuit die.

10. The memory device of claim 1, wherein the individual ones of the static random access memory cells comprise one of a six-transistor static random access memory cell having cross-coupled inverters or a six-transistor static random access memory cell and a plurality of comparison transistors.

11. The memory device of claim 1, further comprising:

a power supply coupled to the monolithic integrated circuit die.

12. A memory device, comprising:

a first integrated circuit die, comprising:

an array of dynamic random access memory cells within a first region of a first lateral plane, individual ones of the dynamic random access memory cells of the array comprising a select transistor and a capacitor structure; and memory tag circuitry integrated with the array of memory cells, the memory tag circuitry comprising a plurality of static random access memory cells within a second region of a second lateral plane vertically offset with respect to the first lateral plane, wherein the second region is within a shadow of the first region, the memory tag circuitry and the array of dynamic random access memory cells are vertically aligned, and the second region of the second lateral plane comprises only the memory tag circuitry and no other circuitry; and a second integrated circuit die, comprising memory support circuitry, the second integrated circuit die coupled to and in vertical alignment with the first integrated circuit die.

13. The memory device of claim 12, wherein the memory tag circuitry is to determine a received memory address is valid, and, in response to being validated, signal the dynamic random access memory cells to retrieve data corresponding to the received memory address.

14. The memory device of claim 12, wherein individual ones of the static random access memory cells comprise a plurality of transistors, and individual ones of the plurality of transistors are connected to the array of dynamic random access memory cells by a plurality of metallization layers, wherein the first integrated circuit die comprises the plurality of metallization layers.

15. The memory device of claim 14, wherein the individual ones of the plurality of transistors each comprise a channel structure substantially parallel to the second lateral plane.

16. The memory device of claim 14, wherein the plurality of metallization layers comprise a plurality of first metallization layers between the plurality of transistors and the array of dynamic random access memory cells and a plurality of second metallization layers over and laterally adjacent the array of dynamic random access memory cells.

17. The memory device of claim 12, wherein the first integrated circuit die and the second integrated circuit die are coupled by bump structures therebetween.

18. The memory device of claim 12, wherein the first integrated circuit die and the second integrated circuit die are coupled by hybrid bonding by metallization structures therebetween and dielectric material between individual ones of the metallization structures.

19. The memory device of claim 18, wherein the dynamic random access memory cells are between the memory tag circuitry and the second integrated circuit die.

20. The memory device of claim 12, wherein the individual ones of the static random access memory cells comprise one of a six-transistor static random access memory cell having cross-coupled inverters or a six-transistor static random access memory cell and a plurality of comparison transistors.

21. The memory device of claim 12, further comprising:

a power supply coupled to the first integrated circuit die and the second integrated circuit die.

*   *   *   *   *